(12) United States Patent
Coakeley et al.

(10) Patent No.: US 6,920,604 B2
(45) Date of Patent: Jul. 19, 2005

(54) SYSTEMS AND METHODS FOR HIGH SPEED SERIAL ENCODING AND DECODING FOR DATA AND CONTROL INTERFACES

(75) Inventors: Matthew Coakeley, Stittsville (CA); Erik Trounce, Nepean (CA); David Kirk, Manotick (CA); Michael Vandegriend, Ottawa (CA); Richard DeBoer, Manotick (CA); Nizar Rida, Nepean (CA)

(73) Assignee: Galazar Networks, Inc., Nepean (CA)

( * ) Notice: Subject to any disclaimer, the term of this patent is extended or adjusted under 35 U.S.C. 154(b) by 540 days.

(21) Appl. No.: 10/117,208

(22) Filed: Apr. 8, 2002

(65) Prior Publication Data

US 2004/0093552 A9 May 13, 2004

(51) Int. Cl.[7] ............... H03M 13/11; H03M 13/03; G06F 11/10
(52) U.S. Cl. .................................. 714/802
(58) Field of Search .............. 714/802; H03M 13/03, H03M 13/11; G06F 11/10

(56) References Cited

U.S. PATENT DOCUMENTS

| | | | | |
|---|---|---|---|---|
| 4,271,521 A | * | 6/1981 | Mahmood | 714/802 |
| 4,930,127 A | | 5/1990 | Abaziou et al. | 370/110.4 |
| 5,251,219 A | | 10/1993 | Babb | 371/37.4 |
| 5,263,163 A | * | 11/1993 | Holt et al. | 710/242 |
| 5,699,062 A | | 12/1997 | Widmer | 341/58 |
| 5,781,568 A | | 7/1998 | Hsieh | 371/40.12 |
| 5,862,160 A | | 1/1999 | Irvin et al. | 371/53 |
| 6,212,616 B1 | * | 4/2001 | Arimilli et al. | 711/220 |
| 6,282,685 B1 | | 8/2001 | Petty et al. | 714/758 |
| 6,425,033 B1 | * | 7/2002 | Conway et al. | 710/305 |

FOREIGN PATENT DOCUMENTS

JP 57162550 A * 10/1982 ............ G06F/11/10

OTHER PUBLICATIONS

Anne, N.B. et al.; Three and four–dimensional parity–check codes for correction and detection of multiple errors; Information Technology: Coding and Computing, 2004. Proceedings. ITCC 2004. International Conference on, vol., 2, Apr. 5–7, 2004, pp 837–842.*

* cited by examiner

*Primary Examiner*—R. Stephen Dildine

(57) ABSTRACT

Systems and methods for encoding and decoding serial bit streams are provided. A parity bit is computed for each nibble, with the parity alternating between odd and even in a regular manner for normal data, and with parity having predetermined different patterns to indicate the start of a packet or the end of a packet. Special code words indicate the idle state and an error state. In some systems an extra vertical parity channel is provided in association with a group of data channels, the vertical parity channel effectively providing a protection channel.

51 Claims, 7 Drawing Sheets

SYSTEMS AND METHODS FOR HIGH SPEED SERIAL ENCODING AND DECODING FOR DATA AND CONTROL INTERFACES

FIELD OF THE INVENTION

The invention relates to systems and methods of performing serial encoding and decoding for data and control interfaces.

BACKGROUND OF THE INVENTION

High speed serial communications paths, such as may exist between components in an optical networking node, are typically subject to very low error rates. An example of a baseline bit error rate which might be desirable for such serial links is $10^{-12}$. An example rate of such a link is 2.5 Gbps for a short haul connection between a port card and a switching matrix. In such a system, when operating normally, it takes an average of thousands of seconds before an error will occur. Various coding schemes have been developed for such applications.

One scheme not originally designed for this application but which has become a popular choice is commonly referred to as 8B/10B is taught in U.S. Pat. No. 4,486,739 to Franaszek, et al. entitled "Byte oriented DC balanced (0,4) 8B/10B partitioned block transmission code" which issued Dec. 4, 1984. With this scheme, 8 bit bytes are encoded into 10 bit code words. The code is crafted to allow a maximum of 4 "1"s or 4 "0"s in a row for data words. This is because another purpose of such codes is to provide sufficient transitions that timing recovery can be performed at a decoder, typically at a receiver. There are special start of packet (SOP) and end of packet (EOP) sequences which indicate the start of a new packet and the end of a current packet respectively. These SOP and EOP packets introduce overhead since data does not start until after the SOP.

Some detection and correction capabilities are provided by this code. One problem with 8B/10B is that there is some latency in the detection of errors. After a neutral code word (one containing 5 "0"s, and 5 "1"s), it is not possible to detect an error until several code words later, and theoretically there is no upper limit on the time it may take to detect an error. If correction is to be performed, then this latency presents a problem. Because latency is not predictable, fault isolation is not possible.

Another significant drawback of the 8B/10B code is that it requires an n+1/n multiplier for the clock rate used for the coded output (and thus also at the receiver) compared to the clock rate for the data per se, where each packet includes n data code words and one SOP code word.

SUMMARY OF THE INVENTION

One broad aspect of the invention provides a method of encoding an input bit stream to produce a serial encoded output. The method involves generating a parity bit for each set of N bits of the bit stream and inserting the parity bit in the serial encoded output in a predetermined position, where $N \geq 4$; wherein a first sequence of parity polarities is continuously repeated to generate a repeating first sequence of parity polarities, the repeating first sequence used on an ongoing basis in generating the parity bits, the first sequence including at least one even parity and one odd parity. The method further involves indicating at least one data stream delineation by inserting at least one sequence of parity polarities different from said first sequence and in place of said repeating first sequence for bits in the serial bit stream at the at least one data stream delineation.

In some embodiments, N=4 such that a parity bit is generated for each nibble.

In some embodiments, the first sequence of parity polarities comprises {odd, even}.

The at least one sequence in some embodiments includes the sequence: {odd, odd, even, even} and/or the sequence: {even, even, odd, odd}.

In some embodiments, the encoded output is a sequence of variable length packets and the at least one data stream delineation comprises a start of packet data stream delineation inserted at the start of each packet.

In some embodiments, the at least one data stream delineation further comprises an end of packet data stream delineation inserted at the end of each packet.

In some embodiments, the encoded output is a sequence of fixed length frames and wherein the at least one data stream delineation comprises a start of frame data stream delineation inserted at the start of each frame.

In some embodiments, the encoded output is a sequence of multi-frames each containing a respective sequence of fixed length frames including a first frame and wherein the second sequence indicates a start of multi-frame data stream delineation which is inserted in the first frame of each multi-frame and the third sequence indicates a start of frame data stream delineation which is inserted at the start of each frame except the first frame.

In some embodiments, the method further involves scrambling a raw input bit stream to produce the input bit stream.

In some embodiments, the method further involves transmitting other special code words each containing a known data content together with a known parity sequence different from the first sequence.

The special code words might for example include a first special code word indicating an idle state; a second special code word indicating an idle state during a multi-frame data stream delineation; and a third special code word indicating an idle state during a frame data stream delineation.

In some embodiments, the method further involves generating a plurality M of serial encoded outputs using the method of claim 1, where $M \geq 2$; for each bit position in the plurality M of serial encoded outputs, computing a vertical parity bit for the bits in the bit position in the plurality of M serial encoded outputs; and outputting the vertical parity bits thus computed in a vertical parity channel.

In some embodiments, the method further involves generating a plurality M of serial encoded outputs using the above described method, where $M \geq 2$; for each data bit position in the plurality M of serial encoded outputs, computing a vertical parity bit for the bits in the bit position in the plurality of M serial encoded outputs; encoding the vertical parity bits thus computed using the above described encoding methods and outputting a vertical parity channel.

In yet further embodiments, the method further involves scrambling M raw input bit streams to produce M serial bit streams with a scrambling pattern; for each of the M serial bit streams generating a respective serial encoded output using the above described encoding methods; for each data bit position in the M raw input bit streams computing a vertical parity bit for the bits in the bit position in the M raw input bit streams; scrambling the vertical parity bits with the scrambling pattern to produce a scrambled sequence of vertical parity bits; and encoding the scrambled sequence of vertical parity bits using the above described methods and outputting a vertical parity channel.

In some embodiments, the method further involves transmitting each of said plurality M of serial encoded outputs and the vertical parity channel on a respective physical channel, the vertical parity channel effectively functioning as a protection channel for the plurality M of serial encoded outputs while also providing some data correction capabilities.

In some embodiments, the method further involves allocating the plurality M of serial encoded outputs and the vertical parity channel collectively to a plurality of users in a time-division multiplexed manner.

In some embodiments, the first sequence is {odd, even}, a second sequence is {odd, odd, even, even}, and a third sequence is {even, even, odd, odd}. A first special code word is 01010 01110, a second special code word is 10001 00111, a third special code word is 00110 01000, a fourth special code word is 01100 11100, a fifth special code word is 11011 00100, and a sixth special code word is 00110 01000, the special code words being used to indicate idle or error states during a given slot.

Another broad aspect of the invention provides an encoder for encoding a serial bit stream to produce an encoded output. The encoder has a scrambler adapted to scramble the serial bit stream to produced a scrambled serial bit stream, a parity calculator adapted to generate a parity bit for each set of N bits of the scrambled serial bit stream and insert the parity bit in the serial encoded output in a predetermined position, where N≧4. A first sequence of parity polarities is continuously repeated to generate a repeating first sequence of parity polarities, the repeating first sequence used on an ongoing basis in generating the parity bits, the first sequence including at least one even parity and one odd parity; wherein at least one data stream delineation is inserted by inserting at least one sequence of parity polarities different from said first sequence and in place of said repeating first sequence for bits in the serial bit stream at the at least one data stream delineation.

The encoder can also be further adapted to implement any of the above summarized methods.

Another broad aspect of the invention provides a method of decoding a received serial bit stream. The method involves summing each set of N+1 bits of the received serial bit stream and determining if the result is even or odd to produce a parity sequence of evens, and odds, where N≧4 and determining that no errors have occurred if the parity sequence obeys a known repeating first sequence of parity polarities, the known repeating first sequence including at least one even parity and one odd parity. The method further involves determining a data stream delineation for a packet has been received if the sequence of evens and odds contains at least known one sequence of parity polarities which is different from said first sequence.

In some embodiments, this method further involves processing the received serial bit stream to determine where in the received bit stream transmitted parity bits should be located. This might for example involve for each possible rotation of the received bit stream (there being N+1×K possible rotations, K being the length of one period of the repeating first sequence) for each parity location for the given rotation, determining if the parity location is correct and if so, adding one to a sum being maintained for that rotation; and after some period of time, selecting the rotation having the largest sum as being the correct rotation.

In another embodiment processing the received serial bit stream to determine where in the received bit stream transmitted parity bits should be located involves for each possible rotation of the received bit stream (there being N+1×K possible rotations, K being the length of one period of the repeating first sequence) for each parity location for the given rotation, determining if the parity location is incorrect and if so, adding one to a sum being maintained for that rotation, and after some period of time, selecting the rotation having the smallest sum as being the correct rotation.

In some embodiments, the method further involves receiving a plurality M of serial encoded outputs using the above-described methods, where M≧2, and receiving a vertical parity channel containing parity bits computed bit-wise between corresponding bit positions of the plurality M of serial encoded outputs, and making error corrections on the basis of the parity calculations and the vertical parity calculations when together they uniquely define an error position in one of the M serial encoded outputs.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
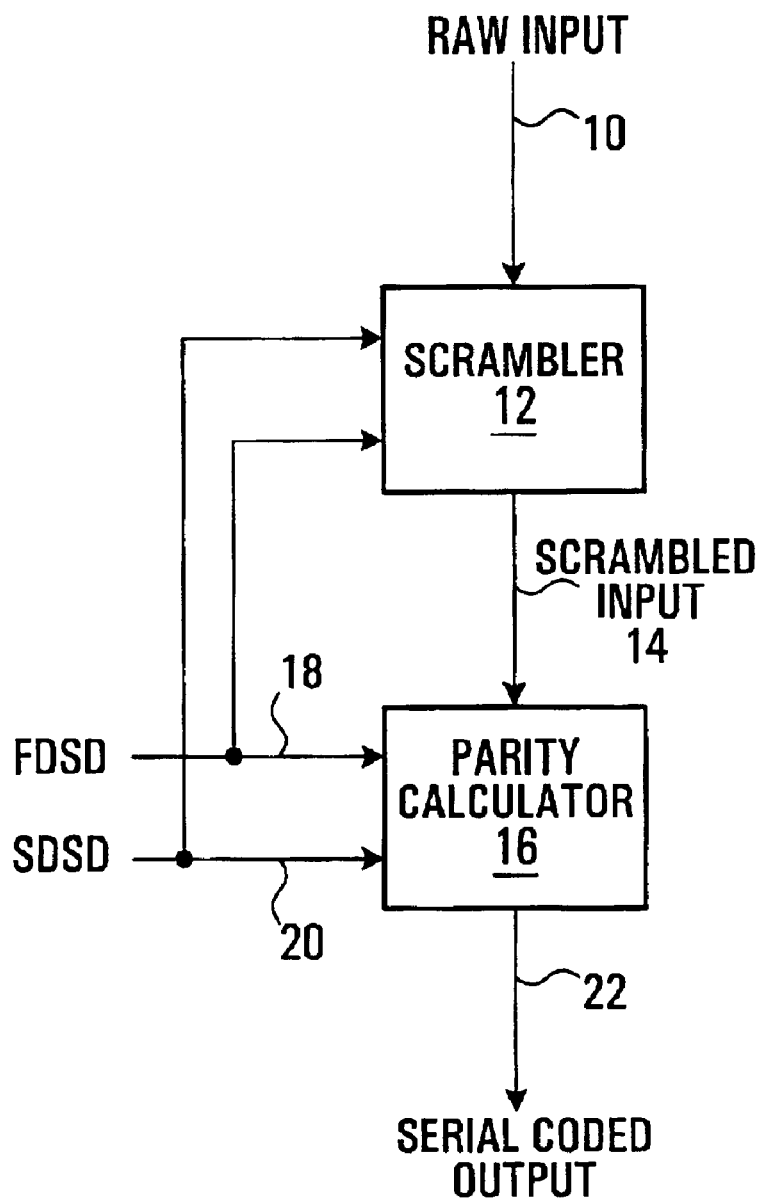
FIG. 1 is a block diagram of an encoder provided by an embodiment of the invention.

Referring first to FIG. 1, shown is a block diagram of a high speed encoder provided by an embodiment of the invention. The high speed encoder has a raw input 10 typically consisting of uncoded bits. However, these "uncoded bits" may be bits to which some other coding has already been applied independent of the processing applied by the encoder of FIG. 1. In a preferred embodiment, the high speed encoder processes the bits eight bits at a time. The raw input 10 is connected to a scrambler 12 which produces a scrambled input 14 which is connected to a parity calculator 16. The parity calculator 16 produces a serial coded output 22 as a function of the scrambled input 14, a FDSD (first data stream delineation) input 18 and in some embodiments also a SDSD (second data stream delineation) input 20.

In some embodiments, the raw input 10 is a packetized serial data stream. In such embodiments, the FDSD input 18 consists of a start of packet indication for each packet and the SDSD input 20 consists of an end of packet indication for each packet. It may not be necessary to include SDSD input 20 for packetized serial data streams which include packet length specified in packet headers.

In some embodiments, the raw input 10 is a multi-framed and framed serial data stream consisting of fixed length multi-frames, with each multi-frame containing a fixed number of frames and each frame containing a number of slots. If there is no data to transmit during a given slot, then an idle code word is transmitted. In such embodiments, the FDSD input 18 is used to indicate the start of a multi-frame, and the SDSD input 20 is used to indicate the start of each frame.

Finally, in some embodiments, the raw input 10 is a framed serial data stream consisting of fixed length frames. If there is no data to transmit during a given frame, then an idle code word is transmitted. In such embodiments, the FDSD input 18 is used to indicate the start of each frame and the SDSD input 20 is not required.

The purpose of the scrambler 12 is to apply a known scrambling to the raw input 10 to decrease the probability of the occurrence of extended periods without enough 0–1 and 1–0 transitions for the receiver PLL (phase locked loop) to lock. Typically, the scrambler 12 scrambles using a known pattern which introduces transitions into a sequence which would otherwise be a repetition structure of 1's or 0's, the assumption being that such a repetition structure is much more likely than a raw data sequence equal to the scrambling sequence (which would scramble to all "0"s). It is noted that the scrambler 12 does not change the maximum run length of non-transitional bits but rather reduces the probability of the maximum run length occurring. It is noted that in embodiments in which transition density is not a requirement, the scrambler may be omitted. However, the scrambling also enables the below described histogram based word alignment algorithm to converge quickly. Without scrambling, if the raw data was all 1's for some period (as could easily be the case with SONET data) the encoded stream would result in the algorithm taking much longer to converge.

Preferably, the scrambler 12 also receives the FDSD input 18 and resets itself at the start of each multi-frame and frame for the multi-frame and frame embodiment, at the start of each frame for the frame only embodiment, and at the start of each packet for the packet embodiment.

The parity calculator 16 computes parity bits based on the scrambled input 14. In a preferred embodiment of the invention, a parity bit is calculated for each nibble (four bits) of the scrambled input 14. A first parity bit is computed for the four most significant bits (the most significant nibble) of each eight scrambled raw data bits and is inserted after the four most significant raw data bits. A second parity bit is computed for the four least significant bits (the least significant nibble) of each eight scrambled raw data bits and is inserted after the four least significant raw data bits. The two nibbles plus two parity bits form a ten bit code word. More generally, the first and second parity bits may be inserted in any known manner within the resulting 10 bit code word, but they must always be inserted in the same place so that the location of the parity bits can be determined at a decoder/receiver as described in detail below.

The polarity of the first parity bit is opposite that of the second parity bit. In a preferred embodiment of the invention, the first parity bit is computed as odd parity, meaning the weight of the four most significant bits plus the first parity bit will always be odd, and the second parity bit is computed as even parity, meaning the weight of the four least significant bits plus the second parity bit will always be even. Thus, the sequence of nibble parity obeys the following rule:

odd, even, odd, even . . . .

This even/odd parity insertion scheme will guarantee a maximum run length of 13 non-transitional bits and also allows the detection of a failed link whether the link fails to all 1's or to all 0's. More generally, a repeating first sequence of parity polarities is used on an ongoing basis in generating the parity bits, the repeating sequence including at least one even parity and one odd parity.

In a preferred embodiment, an exception to this rule made when FDSD input 18 indicates a first data frame delineation. For example, this might indicate the start of a frame (for frame only embodiments), the start of a multi-frame (for multi-frame, frame embodiments) or the start of a packet (for packet embodiments). To indicate the first data stream delineation a predetermined known sequence of parity violations is inserted, a parity violation being a parity bit which does not follow the above odd, even sequence used for normal code words. In a preferred embodiment of the invention, this sequence involves transmitting four nibbles (two code words) with the sequence of nibble parity as follows:

odd, odd, even, even.

It can be seen that this particular sequence contains exactly two parity violations compared to that of the regular nibble parity sequence. More particularly, the second and third parity bits violate the normal odd, even sequence.

In another embodiment, preferably a second sequence of parity violations is employed when SDSD input 20 indicates the occurrence of the second data sequence delineation. This may for example indicate the start of a frame in frame and multi-frame embodiments, or the end of a packet in packet embodiments. In one example, the following sequence of nibble parity is employed to indicate an SDSD:

even, even, odd, odd.

Again, it can be seen that this particular sequence contains exactly two parity violations compared to that of the regular nibble parity sequence. More particularly, the first and fourth parity bits violate the normal odd, even sequence.

Another way of thinking of the parity violations is that a different respective sequence of parity polarities is used to indicate each of the FDSD and SDSD from the repeating sequence used to indicate data. In the above example, the repeating sequence used to indicate data is a first sequence {odd, even}; a second sequence is used to indicate a FDSD which is {odd, odd, even, even} and a third sequence which is used to indicate a SDSD is {even, even, odd, odd}. The sequences used to indicate the FDSD and SDSD are preferably longer than the normal sequence used to indicate data, and are preferably of length $\geq 4$. In any case, they must be uniquely distinguishable from each other and from the normal sequence.

The parity calculator 16 uses the FDSD input 18 and the SDSD input 20 to know when to change the parity sequence to indicate either an FDSD or a SDSD. Typically, the FDSD input 18 and the SDSD input 20 are synchronized with the data input 10 and would be generated by a circuit preceding the encoder. Advantageously, whether or not a particular nibble contains normal parity or a parity violation, its ability to transmit payload (data) is unaffected. The signalling information is overlayed over the regular data in the form of parity violations.

In a preferred embodiment, for embodiments with slots there are also a few special code words that mark unused slots, called "idle" code words. For example, in the multi-frame, frame embodiment, there may be slots within a frame which are not used because they are being used to support a lower overall data rate. In one implementation, the idle code word is marked by inverting the parity of the code word (i.e. transmitting even, odd), and by setting the data to a defined pattern. The idle code word takes precedence over the FDSD/SDSD parity, and therefore unique patterns are defined to indicate whether the code word is a normal idle, is an idle as part of a FDSD, or is an idle as part of a SDSD. Idle code words are not scrambled. In one example, the defined patterns, including parity bits are:

Idle-data: 00110 01000
Idle-FDSD: 01010 01110
Idle-SDSD: 10001 00111

Thus, in the event there is no data for the first code word of the two code words being used to indicate an FDSD is idle, the two code words transmitted are the idle-FDSD code word and the normal second code word of the FDSD, namely two nibbles of data with even parity. Similarly, in the event there is no data for the second code word of the two code words being used to indicate an FDSD, the two code words transmitted are the normal first code word of the FDSD, namely two nibbles of data with odd parity and the idle-FDSD code word. In the event there is no data for both the first and second code words being used to indicate an FDSD, then two idle FDSD code words are transmitted.

Similarly, in the event there is no data for the first code word of the two code words being used to indicate an SDSD, the two code words transmitted are the idle-SDSD code word and the normal second code word of the SDSD, namely two nibbles of data with odd parity. Similarly, in the event there is no data for the second code word of the two bytes being used to indicate an SDSD, the two code words transmitted are the normal first code word of the SDSD, namely two nibbles of data with even parity and the idle-SDSD code word. In the event there is no data for both the first and second code words being used to indicate an SDSD are idle, then two idle SDSD code words are transmitted. It is to be understood that other examples may alternatively be employed.

In other embodiments, there is a requirement for a code word which is recognized as being errored. For example, if an intermediary device (between a transmitter and a receiver where complete decoding will occur) does a parity check and determines that a code word is in error it may be useful to pass this information on to a downstream device. This requires an error code word for normal data, an error code word for the FDSD and an error code word for the SDSD when used. Preferably, similar to the Idle-FDSD and Idle-SDSD code words, the Error-FDSD and Error-SDSD code words will have both parity bits inverted from normal data code words.

In the event the first code word of the two code words being used to indicate an FDSD is somehow in error, the two code words transmitted are the error-FDSD code word and the normal second code word of the FDSD, namely two nibbles of data with even parity. Similarly, in the event the second code word of the two code words being used to indicate an FDSD is in error, the two code words transmitted are the normal first code word of the FDSD, namely two nibbles of data with odd parity, and the error-FDSD code word. In the event both the first and second code words being used to indicate an FDSD are in error, then two error-FDSD code words are transmitted.

Similarly, in the event the first code word of the two code words being used to indicate an SDSD is somehow in error, the two code words transmitted are the error-SDSD code word and the normal second code word of the SDSD, namely two nibbles of data with odd parity. Similarly, in the event the second code word of the two code words being used to indicate an SDSD is in error, the two code words transmitted are the normal first code word of the SDSD, namely two nibbles of data with even parity and the error-SDSD code word. In the event both the first and second code words being used to indicate an SDSD are in error, then two error-SDSD code words are transmitted. It is to be understood that other examples may alternatively be employed. For example, the following specific special code words may be employed:

Error-data: 00110 01000
Error-FDSD: 01100 11100
Error-SDSD: 11011 00100

Figure 2:
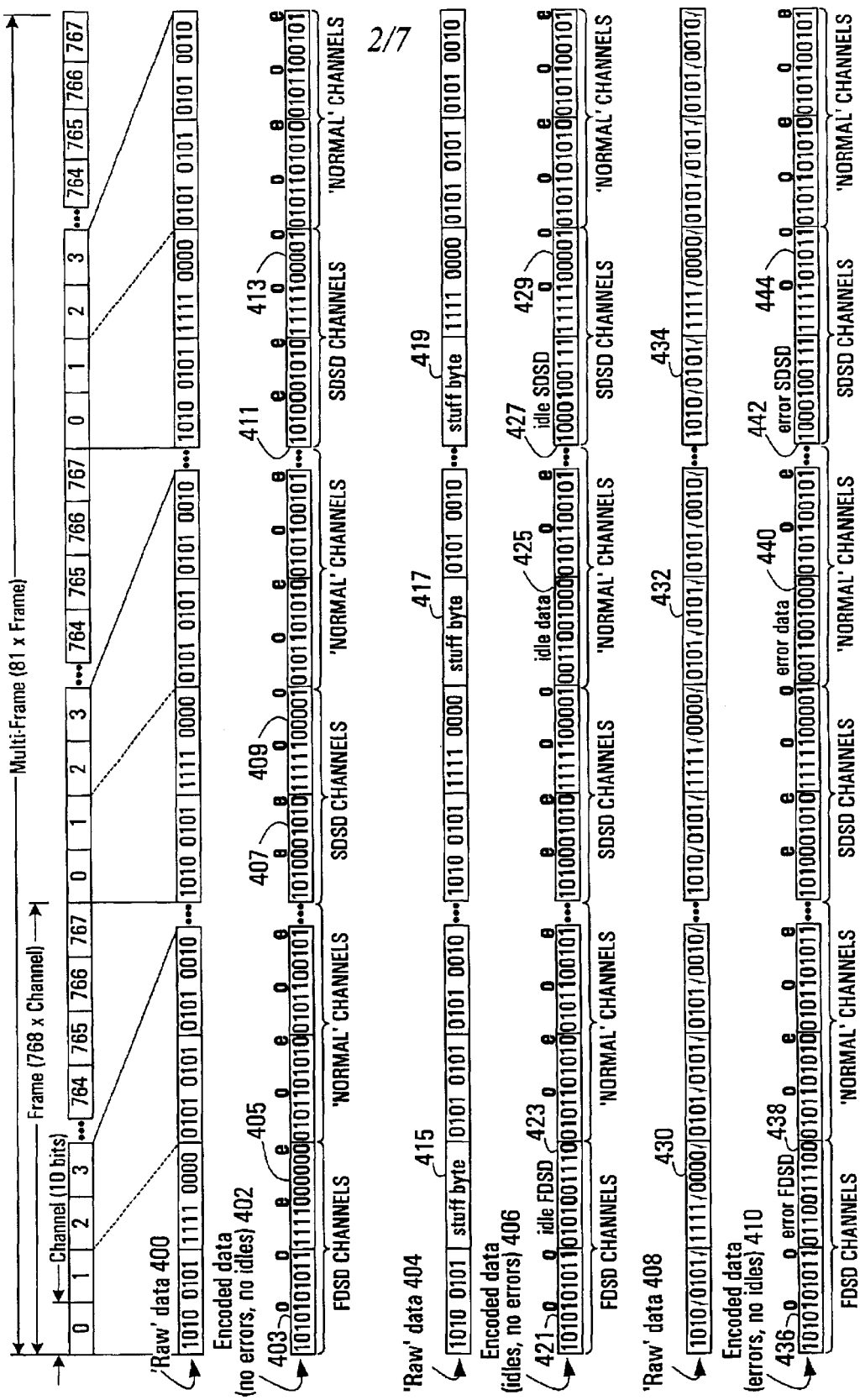
FIG. 2 shows a set of coded data sequences coded using the encoder of FIG. 1 and also employing certain special code words.

An example of the use of these special code words will now be described with reference to FIG. 2. This example assumes a multi-frame structure of the encoded data stream, with each multi-frame being comprised of 81 frames, and each frame being comprised of 768 ten bit slots and each slot containing eight data bits and two parity bits. A first example raw data sequence is indicated generally at 400. The encoded data is generally indicated by 402. In this example there is no error and no idle slot, and the first two slots of the multi-frame 403,405 contain data and an FDSD, and the first two slots of each other frame (e.g. slots 407,409 and slots 411,413) contain data and a SDSD.

A second example raw data sequence is indicated generally at 404. In this case, the sequence contains a number of stuff bytes 415, 417, 419 indicating idle slots. The encoded data is generally indicated by 406. The first slot 421 of the multi-frame contains data and the first half of an FDSD as indicated by the odd, odd parity. The second slot 423 of the multi-frame contains an idle FDSD code word. Slot 425 is a normal data slot not used for either FDSD or SDSD, and since the raw data sequence 404 contains a stuff byte, an idle code word is inserted. Finally, slots 427 and 429 are at the start of a new frame, and should indicate SDSD. Since the first of these slots 427 is idle, it contains the idle-SDSD code word, and the second slot 429 contains the second half of the SDSD as indicated by the odd, odd parity.

In a third example, an encoded sequence at an intermediate device is indicated generally at 408. In this case, the encoded sequence contains a number of slots 430,432 and 434 which are known to be in error as determined from a parity computation. The re-transmitted encoded data is generally indicated by 410. The first slot 436 of the multi-frame contains data and the first half of an FDSD as indicated by the odd, odd parity. The second slot 438 of the multi-frame contains an error-FDSD code word. Slot 432 is a normal data slot not used for either FDSD or SDSD, and since the encoded sequence 408 contains an error, an error-code word is inserted. Finally, slots 442 and 444 are at the start of a new frame, and should indicate SDSD. Since the first of these slots 442 is in error, it contains the error-SDSD code word, and the second slot 444 contains the second half of the SDSD as indicated by the odd, odd parity.

The encoder of FIG. 1 may be implemented using any suitable hardware, software, firmware, or any suitable combination of hardware and/or software and/or firmware. However, for the speeds being considered, preferably the entire encoder is implemented in hardware.

Figure 3:
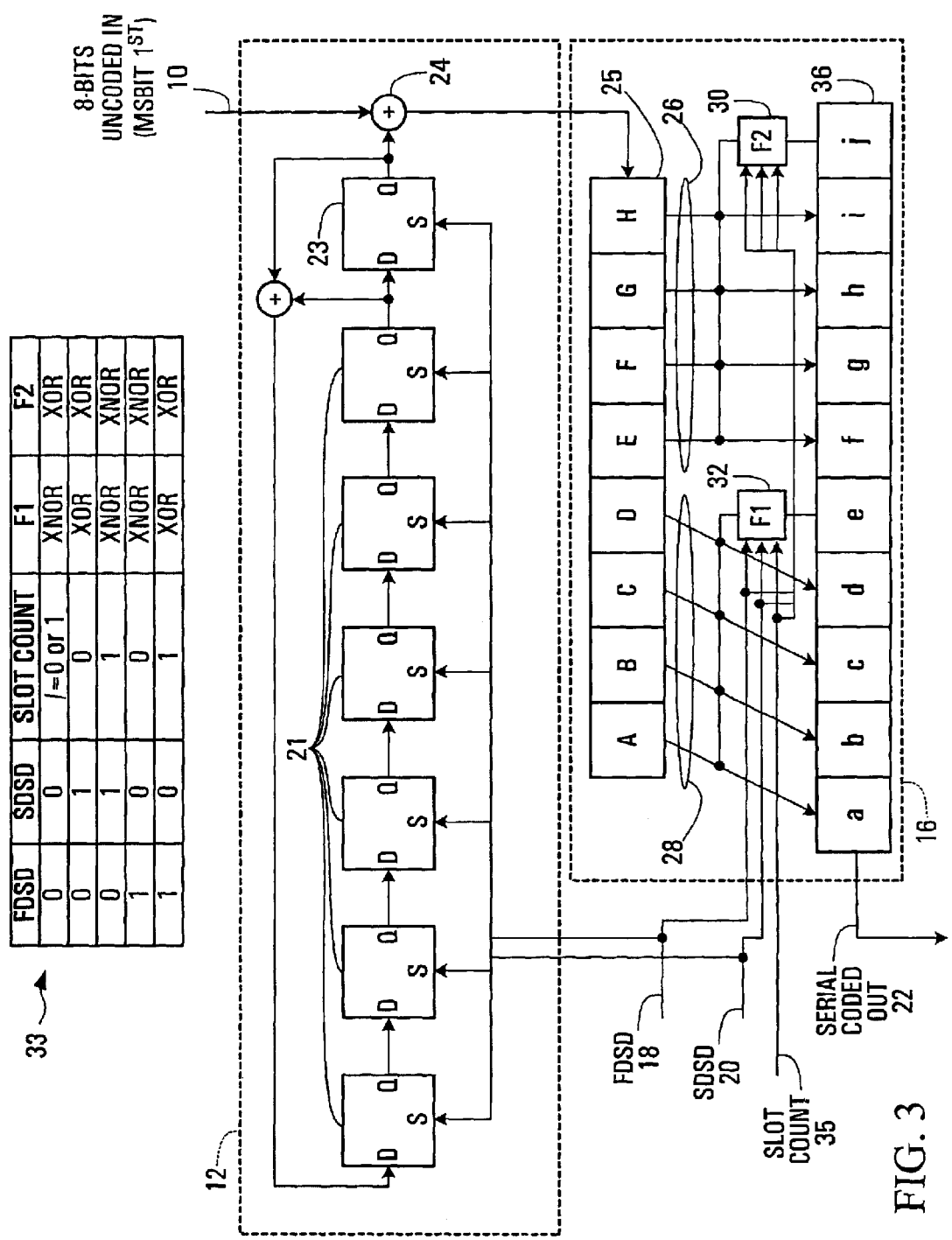
FIG. 3 is a block diagram of an example implementation of the encoder of FIG. 1.

A detailed implementation of a coder of FIG. 1 will now be described with reference to FIG. 3 in which like reference numbers are used to identify like functions. In this example, the scrambler 12 is a synchronous scrambler having the scrambler signature $x^7+x^6+1$ (the SONET/SDH frame synchronous scrambler). The scrambler 12 has a series of registers 21,23 connected in accordance with the scrambler signature. This scrambler 12 generates a repeating 127 bit scrambler pattern at the $x^7$ position 23 which is combined with the uncoded raw input 10 (received most significant bit first) with a modulo-2 adder 24. Each register 21,23 is connected to the FDSD input 18 such that the scrambler resets itself to all "1"s on the most significant bit of the code word following the generation of an FDSD. Thus, each new packet or frame is scrambled with an identical scrambling sequence. It is to be understood that this is only one example implementation of the scrambler 12.

The parity calculator 16 loads eight scrambled bits into a memory element, for example a register 25, having raw bit outputs 26,28. In the illustrated example, the bit positions in the register 25 are labelled A through H, from most significant bit (msb) to least significant bit (lsb). The four raw bit outputs 28 (the four msbs A to D) are connected to a logic function 32 implementing function F1, and to bit positions a to d of an output memory element, for example another register 36 having ten bit positions labelled a through j. The four raw bit outputs 26 (the four lsbs E to H) are connected to a logic function 30 implementing function F2 and to bit positions f to i of output register 36. The output of the logic function 32 is connected to bit position e of the output register 36, and the output of logic function 30 is connected to bit position j of the output register 36. Each of logic functions 30,32 also receives the FDSD input 18, the SDSD input 20, and a slot count indicator 35. The main purpose of the slot count indicator 35 is to distinguish between the first and second code words of a FDSD or a SDSD. Thus it needs to be set to one value for the first code word of an FDSD and SDSD, and to another value for the second code word of an FDSD and SDSD. For all other slots it has no relevance.

In one embodiment, the slot count indicator 35 counts from 0 up to N−1, where there are N slots in a frame. A slot count of 0 identifies the first byte of an FDSD or SDSD and a slot count of 1 identifies the second byte of an FDSD or SDSD.

A truth table for the two logic functions F1 and F2 is generally indicated by 33. It can be seen, that when there is neither a FDSD or a SDSD, F1 is XNOR (odd parity), and F2 is XOR (even parity), thereby achieving the odd, even sequence of nibble parity. For the first byte of FDSD, F1 is XNOR and F2 is XNOR providing odd, odd parity, and for the second byte of FDSD, F1 is XOR and F2 is XOR providing even, even parity. For the first byte of SDSD, F1 is XOR and F2 is XOR providing even, even parity, and for the second byte of SDSD, F1 is XNOR and F2 is XNOR providing odd, odd parity.

In the event one of the special code words is to be transmitted, this is simply overwritten/inserted in place of what would normally be computed.

Figure 4:
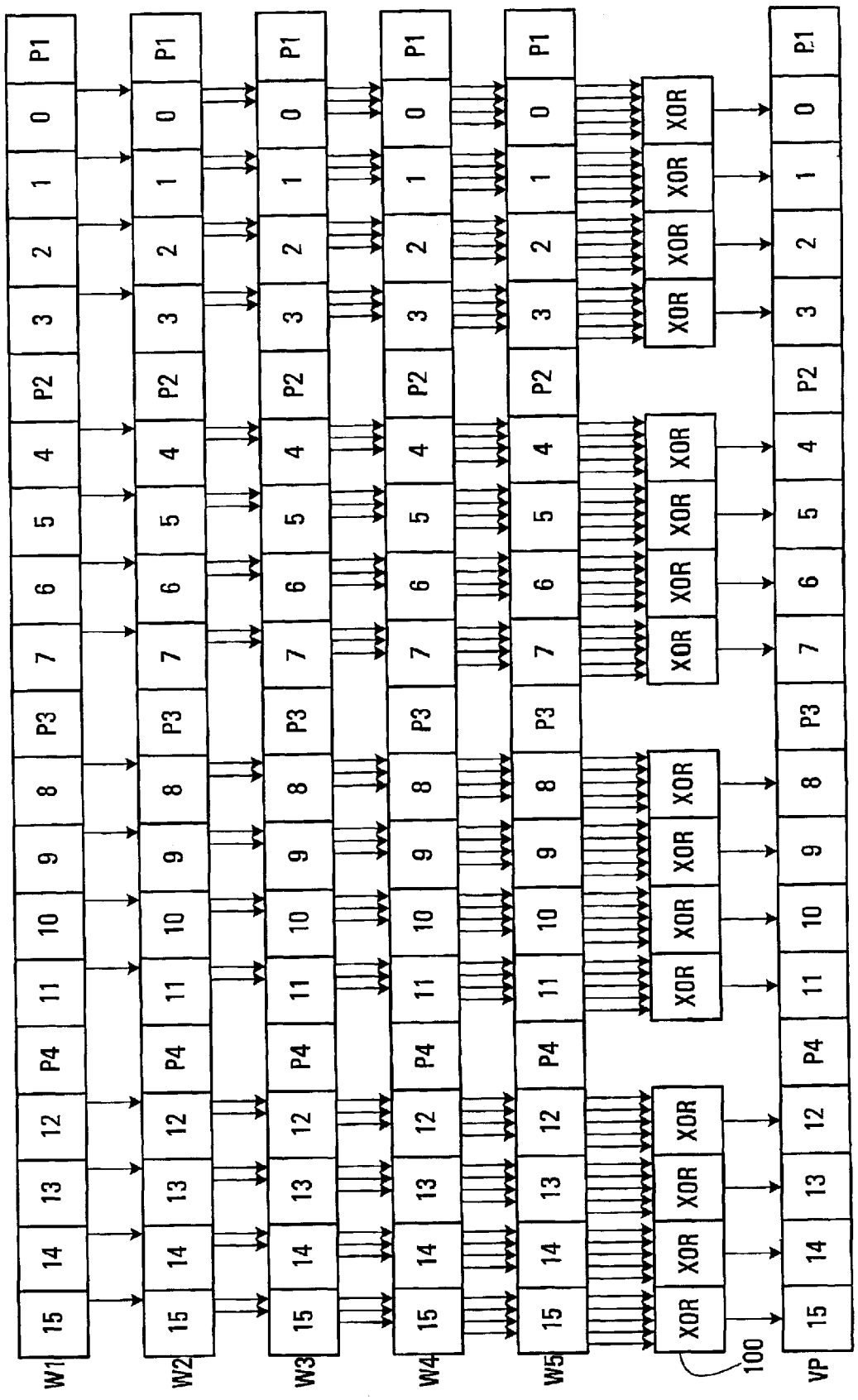
FIG. 4 shows an example of vertical parity calculation provided by an embodiment of the invention.

In another embodiment of the invention, the above discussed encoder is used together with at least one extra "vertical parity channel" to enable some error correction at a receiver. It is assumed that a node performing the encoding in accordance with FIG. 1 or 3 above, has a plurality M of parallel outputs each encoded using the same approach. There is also a sixth output which is the vertical parity output. The sixth output contains data which is simply parity computed bitwise between corresponding bit positions in each of the five data outputs. An example is shown in FIG. 4 where there are shown 20 bits of five data channels labelled W1,W2,W3,W4 and W5 with the bit positions being labelled 0 through 15 for each scrambled data bit output and P1, P2, P3 and P4 for the nibble parity bits computed within each data channel as described previously. There is also shown a single vertical parity channel labelled VP also with bit positions labelled 0 through 15 and P1, P2, P3 and P4. Each bit of the parity channel VP corresponding to a data bit is determined by computing a parity, for example an odd parity, on the corresponding bits of the data channels W1,W2,W3,W4 and W5. This is indicated schematically by each set of corresponding bits being fed into a respective XOR gate 100 having an output connected to the corresponding parity bit location in the vertical parity channel VP.

The vertical parity bits corresponding to parity locations can be computed by computing a horizontal parity among the related vertical parity bits, or vertically among the data parity bits, the result being the same.

In the event scrambling is employed, with the same scrambler used on each data channel it is noted that if vertical parity is computed after scrambling the data then if an even number of data channels exist there will be no scrambling on the vertical parity channel. This is because the scrambling sequences of an even number of data channels will cancel each other out. If there is an odd number of data channels, the vertical parity channel will still effectively be scrambled if computed in this manner.

In one embodiment, the vertical parity for data bit locations is computed prior to scrambling of the data channels in which case then the vertical parity thus computed can simply be encoded using the same encoder used for data channels to scramble the vertical parity bits and to horizontally compute the nibble parity bits. In this case, the FDSD, SDSD must also be factored in when horizontally computing nibble parity bits for the vertical parity channel. In this embodiment, the vertical parity channel does have the benefit of being scrambled.

Decoder Design

After transmission of the encoded bit stream with parity, a decoder, typically part of a receiver but more generally part of a down stream device, receives this, descrambles using the known scrambling pattern assuming the bits were scrambled, and computes locally the parity for each nibble. For each nibble, a comparison between the locally computed parity bit and the expected value (determined according to the odd, even sequence, or other predetermined sequence) is made, and if there is a difference, then there must be an error in the received sequence unless the error is part of one of the predetermined parity sequences used to indicate a FDSD or SDSD.

The decoder must determine where in a sequence of bits the parity bits are. If no other mechanism is provided to allow an identification of where the parity bits are in a long sequence, one way for the decoder to determine this is to compute parities for each rotation of 10 bit windows in the received sequence over some period of time. Eventually, notwithstanding the presence of parity violations due to FDSD, SDSD, the correct positions of the parity bits can be determined. A histogram can be developed having a bin for each possible rotation of the 10 bit positions, 10 in all. More generally, there would be N+1×K possible rotations in all where a parity bit is included for every N data bits (in this example, N=4), and K is the length of one period of the repeating sequence used to indicate data (in this example K=2). Then, each time a given 10 bit sequence for a given rotation yields a valid parity, one is added to the histogram bin for that rotation. Eventually, only the correct rotation will have a significantly larger bin size. Once the correct rotation is determined, the decoder then looks for the parity violation patterns, and processes the incoming bit stream accordingly. Alternatively, the number of parity violations per rotation can be maintained in the histogram, and the rotation having the smallest bin size is determined to be correct. A threshold maximum number of parity violations for the "correct" bin may be established in which case if the maximum is exceeded over the histogram period, the whole process is repeated.

When the vertical parity channel is employed as described above, then the decoder descrambles each of the data channels and the vertical parity channel, assuming scrambling was employed on both the data channels and the vertical parity channel. The receiver then generates (logically if not physically) a picture of the received data such as illustrated by example in FIGS. 4, 5 and 6 described below and is able to correct certain errors.

The inclusion of this additional vertical parity channel VP allows the detection and correction of certain errors in the received bit stream. When a parity error on a nibble of a given data channel is determined, and the vertical parity channel indicates a single error in the vertical parity for that channel, the position of the single error in the vertical parity channel dictates the position of the error on the data channel. Preferably, the parity bits of the vertical parity channel are checked horizontally to determine the integrity of the received vertical parity stream and they are checked vertically to determine the integrity of the parity bits of each working channel. A bit error on the vertical parity channel can only be detected by checking the horizontal parity of the vertical parity channel, and a bit error on any parity bit on any data stream can only be checked by checking the vertical parity of the parity bits.

Figure 5:
FIGS. 5 and 6 show examples of error correction capabilities using the vertical parity of FIG. 4.

An example of this is shown in FIG. 5. Here, for data channel W3, the parity bit P4 is computed and an error is identified, but the position of the error in data channel W3 is not yet determined. First, a horizontal parity among bits 15,14,13,12 of the vertical parity channel is computed and compared to P4 of the vertical parity channel to determine the integrity of the vertical parity channel. Then vertical parity is computed between the data channels, and this is compared to the vertical parity bits received on the vertical parity channel. A vertical parity discrepancy in bit position 14 of the vertical parity channel VP determines that a correctable error took place in bit position 14 of channel W3. Similarly, the combination of parity errors in P2 on data channel W1 and a vertical parity error in position 7 indicate a correctable bit error in position 7 on channel W1.

Figure 6:
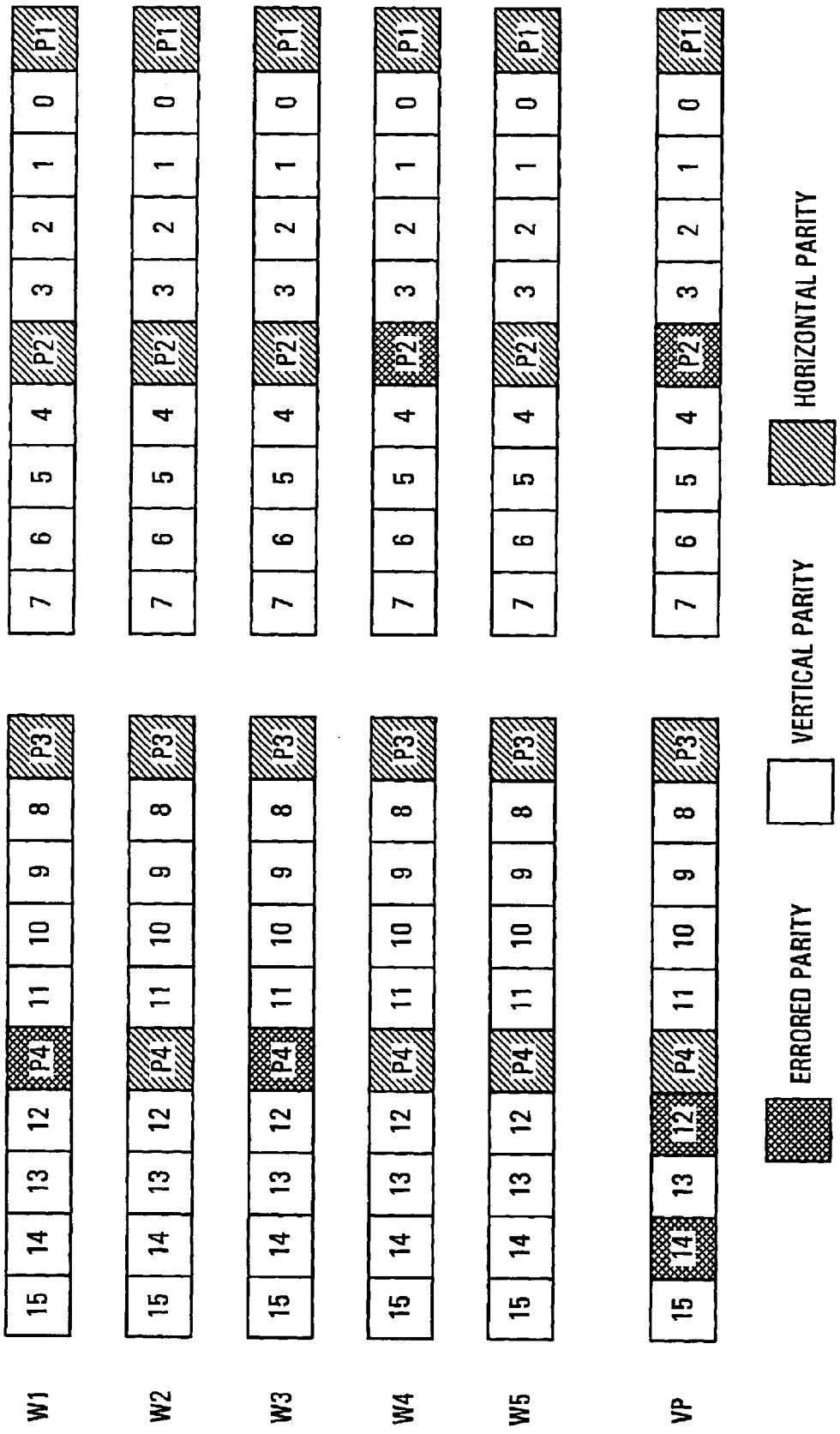

In some circumstances, the errors cannot be corrected. An example of this is shown in FIG. 6. In this example, the parity computations produce parity in parity bits P4 for data channels W1 and W3. Also, the vertical parity channel indicates that there are two parity errors in bit positions 12 and 14. However, there is no way to determine which data channel (either W1 or W3) has the error in position 12, and which data channel has the error in position 14. In another example, a parity error on channel W4 for P2 and a vertical parity error for position P2 on the parity channel P1 together yield a result for which no correction can be made.

If there is an error on the vertical parity channel VP, and none of the data channels indicate an error, then either there was no error, or there were two errors on the data channel, and the latter is highly unlikely given the error rates under consideration.

It is noted that in a particular case when a single link is completely failed, the data for the single link can be completely recovered from the vertical parity channel assuming no other errors occur.

Figure 7:
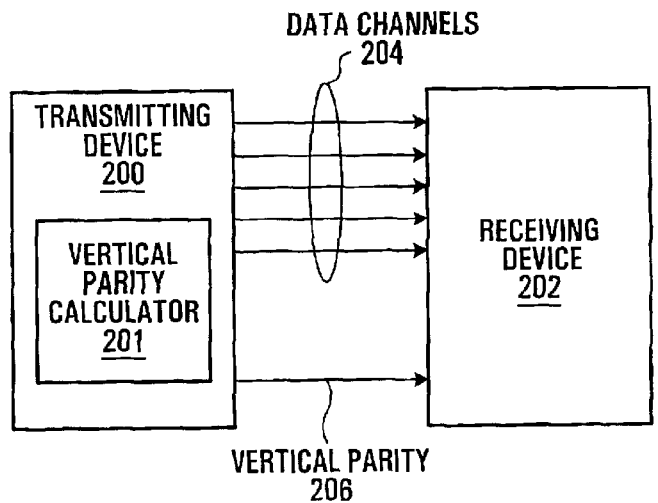
FIG. 7 is a block diagram of a system employing the vertical parity channel on a separate physical connection.

In a preferred embodiment, the vertical parity channel is sent over a different physical link such that if one link fails completely, the vertical parity channel will likely not have failed. An example of this is shown in FIG. 7 where a transmitting device 200 is transmitting data to a receiving device 202 over five separate physical data channels 204 and a single vertical parity channel 206. The transmitting device 200 has a respective encoder (not shown) for each of the data channels 204 and has a vertical parity calculator 201 which calculates the contents of the vertical parity channel 206. In this embodiment, the vertical parity channel 206 effectively functions as a protection channel since any of the regular data channels can fail, and their data can be recovered from the vertical parity channel 206.

Figure 8:
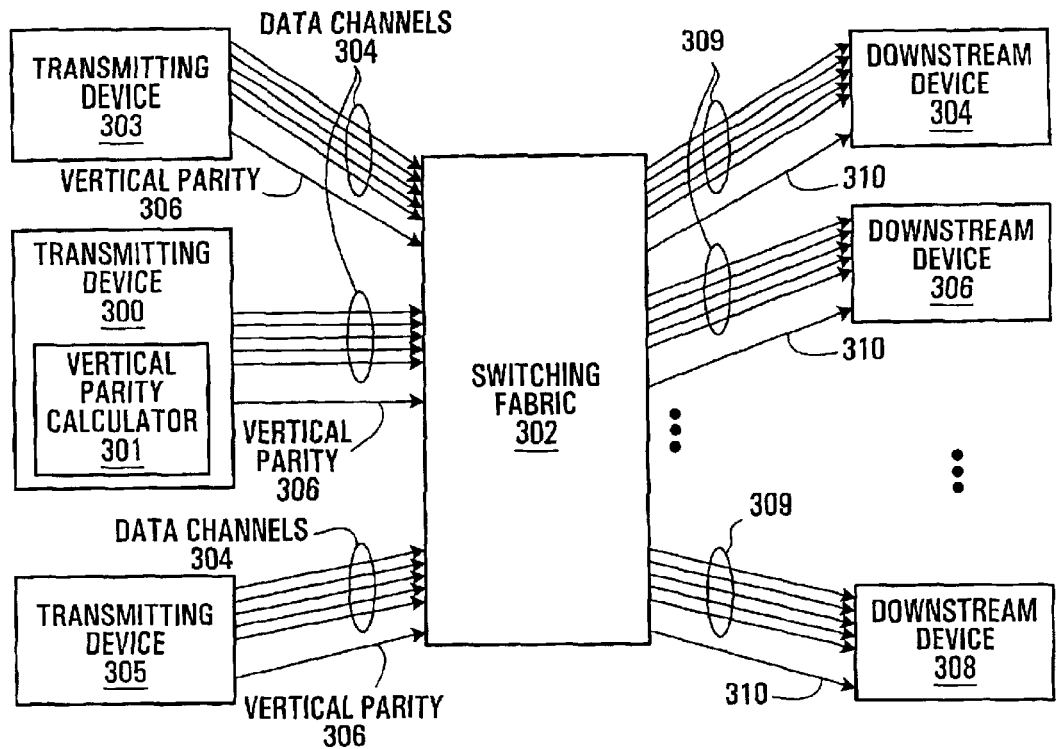
FIG. 8 is a block diagram of another system employing vertical parity channels on separate physical connections.

In another preferred embodiment, data for a given downstream device is multiplexed across the links for which the vertical parity channel is computed, to form a wider band channel for the downstream device. This overall wider band channel is then time division multiplexed across different devices. At any given instant a time segment of the wide band channel does contain all the parity information necessary for the given device to make corrections. An example of this is shown in FIG. 8 where again there are five data channels 304 and one vertical parity channel 306 connecting each of a number of transmitting devices 300,303, . . . ,305 (only three shown) and a switching fabric 302 (or other intermediate device). In the interest of clarity, only the details of one transmitting device 300 are shown. The transmitting device 300 has a respective encoder (not shown) for each of the data channels 304 and has a vertical parity calculator 301 which calculates the contents of the vertical parity channel 306. As in the example of FIG. 7, the vertical parity channel 306 is effectively functions as a protection channel for the data channels 304 while also providing error correction. Switching fabric 302 is connected to downstream devices 304, 306, . . . ,308 (only three shown) again through a respective set of five data channels 309 and a respective parity channel 310. For each transmitting device 300,303,305, the data channels 304 and the vertical parity channel 306 collectively form a wideband channel which is divided in time division fashion between being allocated to the various downstream devices 304,306, 308. For example for a time first period, data transmitted on the data channels 304 and the vertical parity channel 306 from the first transmitting device is destined for downstream device 304. During a second period, data transmitted on the data channels 304 and the parity channel 306 from transmitting device 300 is destined for the second device 306, and so on for each of the devices up to the last downstream device 308 to receive data. The same is true for data and vertical parity transmitted by the other transmitting devices 303,305. In this embodiment, the switching fabric does not necessarily examine the vertical parity channel, but rather this is left to the downstream devices 304,306,308. Because of this, at the switching fabric, it is important that the vertical parity data be shipped off to the same place as the regular data. If the switching fabric does examine the vertical parity channel, then if errors are identified, error code words can be inserted as described previously.

Numerous modifications and variations of the present invention are possible in light of the above teachings. It is therefore to be understood that within the scope of the appended claims, the invention may be practised otherwise than as specifically described herein.

We claim:

1. A method of encoding an input bit stream to produce a serial encoded output comprising:

generating a parity bit for each set of N bits of the bit stream and inserting the parity bit in the serial encoded output in a predetermined position, where $N \geq 4$;

wherein a first sequence of parity polarities is continuously repeated to generate a repeating first sequence of parity polarities, the repeating first sequence used on an ongoing basis in generating the parity bits, the first sequence including at least one even parity and one odd parity;

the method further comprising:

indicating at least one data stream delineation by inserting at least one sequence of parity polarities different from said first sequence and in place of said repeating first sequence for bits in the serial bit stream at the at least one data stream delineation.

2. A method according to claim 1 wherein N=4 such that a parity bit is generated for each nibble.

3. A method according to claim 2 wherein the first sequence of parity polarities comprises {odd, even}.

4. A method according to claim 2 wherein said at least one sequence comprises a second sequence: {odd, odd, even, even}.

5. A method according to claim 2 wherein said at least one sequence comprises a second sequence: {even, even, odd, odd}.

6. A method according to claim 4 wherein said at least one sequence comprises a third sequence: {even, even, odd, odd}.

7. A method according to claim 2 wherein:

the first sequence of parity polarities comprises {odd, even};

the at least one sequence comprises a second sequence {odd, odd, even, even} indicating a first type of data stream delineation and a third sequence {even, even, odd, odd} indicating a second type of data stream delineation.

8. A method according to claim 2 wherein the encoded output is a sequence of variable length packets and wherein the at least one data stream delineation comprises a start of packet data stream delineation inserted at the start of each packet.

9. A method according to claim 8 wherein the at least one data stream delineation further comprises an end of packet data stream delineation inserted at the end of each packet.

10. A method according to claim 2 wherein the encoded output is a sequence of fixed length frames and wherein the at least one data stream delineation comprises a start of frame data stream delineation inserted at the start of each frame.

11. A method according to claim 7 wherein the encoded output is a sequence of multi-frames each containing a respective sequence of fixed length frames including a first frame and wherein the second sequence indicates a start of multi-frame data stream delineation which is inserted in the first frame of each multi-frame and the third sequence indicates a start of frame data stream delineation which is inserted at the start of each frame except the first frame.

12. A method according to claim 2 further comprising:

scrambling a raw input bit stream to produce said input bit stream.

13. A method according to claim 2 further comprising transmitting other special code words each containing a known data content together with a known parity sequence different from the first sequence.

14. A method according to claim 11 further comprising transmitting other special code words each containing a known data content together with a known parity sequence different from the first sequence.

15. A method according to claim 14 wherein the special code words comprise:

a first special code word indicating an idle state;

a second special code word indicating an idle state during a multi-frame data stream delineation;

a third special code word indicating an idle state during a frame data stream delineation.

16. A method according to claim 15 wherein the special code words comprise:

a first special code word indicating an error state;

a second special code word indicating an error state during a multi-frame data stream delineation;

a third special code word indicating an error state during a frame data stream delineation.

17. A method according to claim 1 further comprising:

generating a plurality M of serial encoded outputs using the method of claim 1, where $M \geq 2$;

for each bit position in the plurality M of serial encoded outputs, computing a vertical parity bit for the bits in the bit position in the plurality of M serial encoded outputs;

outputting the vertical parity bits thus computed in a vertical parity channel.

18. A method according to claim 2 further comprising:

generating a plurality M of serial encoded outputs using the method of claim 2, where $M \geq 2$;

for each data bit position in the plurality M of serial encoded outputs, computing a vertical parity bit for the bits in the bit position in the plurality of M serial encoded outputs;

encoding the vertical parity bits thus computed using the method of claim 2 and outputting a vertical parity channel.

19. A method according to claim 2 further comprising:

scrambling M raw input bit streams to produce M serial bit streams with a scrambling pattern;

for each of the M serial bit streams generating a respective serial encoded output using the method of claim 2;

for each data bit position in the M raw input bit streams computing a vertical parity bit for the bits in the bit position in the M raw input bit streams;

scrambling the vertical parity bits with the scrambling pattern to produce a scrambled sequence of vertical parity bits;

encoding the scrambled sequence of vertical parity bits using the method of claim 2 and outputting a vertical parity channel.

20. A method according to claim 19 further comprising:

transmitting each of said plurality M of serial encoded outputs and the vertical parity channel on a respective physical channel, the vertical parity channel effectively functioning as a protection channel for the plurality M of serial encoded outputs while also providing some data correction capabilities.

21. A method according to claim 20 further comprising:

allocating the plurality M of serial encoded outputs and the vertical parity channel collectively to a plurality of users in a time-division multiplexed manner.

22. A method of encoding an input bit stream to produce an encoded output comprising:

generating a parity bit for each set of four bits of the bit stream and inserting the parity bit in the serial encoded output in a predetermined position, where $N \geq 4$;

wherein a first sequence of parity polarities is continuously repeated to generate a repeating first sequence of parity polarities, the repeating first sequence used on an ongoing basis in generating the parity bits, the first sequence including at least one even parity and one odd parity;

wherein the encoded output is a sequence of multi-frames each containing a respective sequence of fixed length frames including a first frame, each frame comprising a plurality of ten bit slots including a first slot and a second slot, each slot containing eight data bits and two parity bits;

indicating a start of each multi-frame by:

if there is data to transmit during the first and second slot of the first frame of a multi-frame, indicating a start of the multi-frame by inserting a second sequence of four parity polarities different from said first sequence and in place of said first sequence during the first and second slot of the first frame of the multi-frame, the second sequence of four parity polarities including a first two parity polarities and a second two parity polarities;

if there is data to transmit during the first slot of the first frame of the multi-frame and no data to transmit during the second slot of the first frame of the multi-frame, indicating a start of multi-frame by inserting a first special ten bit idle code word during the second slot and by inserting the first two parity polarities in place of said first sequence during the first slot;

if there is data to transmit during the second slot of the first frame of the multi-frame and there is no data to transmit during the first slot of the first frame of the multi-frame, indicating a start of multi-frame by inserting the first special ten bit idle code word during the first slot and by inserting the second two parity polarities in place of said first sequence during the second slot;

if there is no data to transmit during the first slot of the first frame of the multi-frame and there is no data to transmit during the second slot of the first frame of the multi-frame, indicating a start of multi-frame by inserting the first special ten bit idle code word during the first slot and during the second slot in place of said first sequence during the first slot and the second slot;

indicating a start of each frame other than the first frame of a multi-frame by:

if there is data to transmit during the first and second slot of the frame, indicating a start of frame by inserting a third sequence of four parity polarities different from said first sequence and in place of said first sequence during the first and second slot of the frame, the third sequence of four parity polarities including a first two parity polarities and a second two parity polarities;

if there is data to transmit during the first slot of the frame and no data to transmit during the second slot of the frame, indicating a start of frame by inserting a second special ten bit idle code word during the second slot and by inserting the first two parity polarities of the third sequence in place of said first sequence during the first slot;

if there is data to transmit during the second slot of the frame and there is no data to transmit during the first slot of the frame, indicating a start of frame by inserting the second special ten bit idle code word during the first slot and by inserting the second two parity polarities of the third sequence in place of said first sequence during the second slot;

if there is no data to transmit during the first slot of the frame and there is no data to transmit during the second slot of the frame, indicating a start of frame by inserting the second special ten bit idle code word during the first slot and during the second slot in place of said first sequence during the first slot and the second slot;

if there is no data to transmit during a slot other than the first or second slot of any frame, inserting a third special code word.

23. A method according to claim 22 further comprising:

further indicating the start of each multi-frame by:

if there is data to transmit during the first slot of the first frame of the multi-frame and there is an error in respect of data to transmit during the second slot of the first frame of the multi-frame, indicating a start of multi-frame by inserting a fourth special ten bit error code word during the second slot and by inserting the first two parity polarities of the second sequence in place of said first sequence during the first slot;

if there is an error in respect of data to transmit during the first slot of the first frame of the multi-frame and there is data to transmit during the second slot of the first frame of the multi-frame, indicating a start of multi-frame by inserting the fourth special ten bit error code word during the first slot and by inserting the second two parity polarities of the second sequence in place of said first sequence during the second slot;

if there is an error in respect of data to transmit during the first slot of the first frame of the multi-frame and there is an error in respect of data to transmit during the second slot of the first frame of the multi-frame, indicating a start of the multi-frame by inserting the third special ten bit error code word during the first slot and during the second slot in place of said first sequence during the first slot and the second slot;

further indicating the start of each frame other than the first frame of a multi-frame by:

if there is data to transmit during the first slot of the frame and an error in respect of data to transmit during the second slot of the frame, indicating a start of frame by inserting a fifth special ten bit error code word during the second slot and by inserting the first two parity polarities of the third sequence during the first slot;

if there is data to transmit during the second slot of the frame and there is an error in respect of data to transmit during the first slot of the frame, indicating a start of frame by inserting the fifth special ten bit error code word during the first slot and by inserting the second two parity polarities of the third sequence during the second slot;

if there is an error in respect of data to transmit during the first slot of the frame and there is an error in respect of data to transmit during the second slot of the frame, indicating a start of frame by inserting the fifth special ten bit error code word during the first slot and during the second slot in place of said first sequence during the first slot and the second slot;

if there is an error in respect of a slot other than the first or second slot, inserting a sixth special code word.

24. A method according to claim 23 wherein
the first sequence is {odd, even},
the second sequence is {odd, odd, even, even},
the third sequence is {even, even, odd, odd},
the first special code word is 01010 01110,
the second special code word is 10001 00111,
the third special code word is 00110 01000,
the fourth special code word is 01100 11100,
the fifth special code word is 11011 00100,
the sixth special code word is 00110 01000.

25. An encoder for encoding a serial bit stream to produce an encoded output the encoder comprising:
- a scrambler adapted to scramble the serial bit stream to produced a scrambled serial bit stream;
- a parity calculator adapted to generate a parity bit for each set of N bits of the scrambled serial bit stream and insert the parity bit in the serial encoded output in a predetermined position, where $N \geq 4$;
- wherein a first sequence of parity polarities is continuously repeated to generate a repeating first sequence of parity polarities, the repeating first sequence used on an ongoing basis in generating the parity bits, the first sequence including at least one even parity and one odd parity;
- wherein at least one data stream delineation is inserted by inserting at least one sequence of parity polarities different from said first sequence and in place of said repeating first sequence for bits in the serial bit stream at the at least one data stream delineation.

26. An encoder according to claim 25 wherein N=4 such that a parity bit is computed for each nibble.

27. An encoder according to claim 26 wherein the first sequence of parity polarities comprises {odd, even}.

28. An encoder according to claim 27 wherein said at least one sequence comprises a second sequence: {even, even, odd, odd}.

29. An encoder according to claim 28 wherein said at least one sequence comprises a third sequence: {odd, odd, even, even}.

30. An encoder according to claim 29 wherein the second sequence is used to indicate a start of packet boundary and the third sequence is used to indicate an end of packet boundary.

31. An encoder according to claim 26 adapted to, for each eight bits of the scrambled serial bit stream having bit positions one through eight, insert parity bits after the fourth bit position and after the eighth bit position.

32. An encoder according to claim 31 further adapted to indicate other special code words by outputting a known data content together with a known parity sequence different from the first sequence.

33. An encoder according to claim 32 wherein the special code words comprise a first special code word to indicate an idle code word, a second special code word to indicate an idle FDSD code word, and a third special code word to indicate an idle SDSD code word, a fourth special first code word to indicate an error and an FDSD, and a fifth special code word to indicate an error and an SDSD.

34. An apparatus comprising:
- a plurality M of encoders each producing a respective serial encoded output from a respective serial bit stream, where $M \geq 2$ each encoder comprising:
- a scrambler adapted to scramble the respective serial bit stream to produce a respective scrambled serial bit stream;
- a respective parity calculator adapted to generate a parity bit for each set of N bits of the respective scrambled serial bit stream and insert the parity bit in the respective serial encoded output in a predetermined position, where $N \geq 4$;
- wherein a first sequence of parity polarities is continuously repeated to generate a repeating first sequence of parity polarities, the repeating first sequence used on an ongoing basis in generating the parity bits, the first sequence including at least one even parity and one odd parity;
- wherein at least one data stream delineation is inserted by inserting at least one sequence of parity polarities different from said first sequence and in place of said repeating first sequence for bits in the respective serial bit stream at the at least one data stream delineation;

the apparatus further comprising:
- a vertical parity calculator adapted to, for each bit position in the plurality M of serial encoded outputs, compute a vertical parity bit for the bits in the bit position in the plurality of M serial encoded outputs;
- the apparatus having a vertical parity channel output containing the vertical parity bits.

35. An apparatus according to claim 34 having a plurality M+1 of physical channel outputs, the apparatus being adapted to output each of said plurality M of serial encoded outputs and the vertical parity channel on a respective physical channel output, the vertical parity channel effectively functioning as a protection channel for the plurality M of serial encoded outputs while also providing some data correction capabilities.

36. An apparatus according to claim 35 further comprising:
- a time division multiplexer circuit adapted to allocate the plurality M of serial encoded outputs and the vertical parity channel collectively to a plurality of users in a time-division multiplexed manner.

37. A method of decoding a received serial bit stream comprising:
- summing each set of N+1 bits of the received serial bit stream and determining if the result is even or odd to produce a parity sequence of evens, and odds, where $N \geq 4$;
- determining that no errors have occurred if the parity sequence obeys a known repeating first sequence of parity polarities, the known repeating first sequence including at least one even parity and one odd parity;
- the method further comprising:
- determining a data stream delineation for a packet has been received if the sequence of evens and odds contains at least known one sequence of parity polarities which is different from said first sequence.

38. A method according to claim 37 wherein N=4 such that the received serial bit stream contains a parity bit for each nibble.

39. A method according to claim 37 wherein the first sequence of parity polarities comprises {odd, even}, and this sequence is repeated on an ongoing basis as said repeating first sequence.

40. A method according to claim 37 wherein said at least one sequence comprises a second sequence: {odd, odd, even, even}.

41. A method according to claim 37 wherein said at least one sequence comprises a second sequence: {even, even, odd, odd}.

42. A method according to claim 40 wherein said at least one sequence comprises a third sequence: {even, even, odd, odd}.

43. A method according to claim 38 wherein:
- the first sequence of parity polarities comprises {odd, even}, and this sequence is repeated on an ongoing basis as said repeating first sequence;
- the at least one sequence comprises a second sequence {odd, odd, even, even} and a third sequence {even, even, odd, odd}.

44. A method according to claim 37 wherein the at least one data stream delineation comprises a start of packet and an end of packet, with a respective sequence being used to indicate each of the start of packet and the end of packet.

45. A method according to claim 43 wherein the at least one data stream delineation comprises a start of packet and an end of packet, with a respective one of the first and second sequences being used to indicate each of the start of packet and the end of packet.

46. A method according to claim 37 further comprising:
extracting data bits from the received serial bit stream to produce a scrambled received bit stream;
descrambling the scrambled received bit stream to produce a decoded received bit stream.

47. A method according to claim 37 further comprising:
on an ongoing basis searching for other special code words in the received serial bit stream, the other special code words containing a known data content together with a known parity sequence different from the first sequence.

48. A method according to claim 37 further comprising:
processing the received serial bit stream to determine where in the received bit stream transmitted parity bits should be located.

49. A method according to claim 48 wherein processing the received serial bit stream to determine where in the received bit stream transmitted parity bits should be located comprises:
for each possible rotation of the received bit stream (there being N+1×K possible rotations, K being the length of one period of the repeating first sequence) for each parity location for the given rotation, determining if the parity location is correct and if so, adding one to a sum being maintained for that rotation;
after some period of time, selecting the rotation having the largest sum as being the correct rotation.

50. A method according to claim 48 wherein processing the received serial bit stream to determine where in the received bit stream transmitted parity bits should be located comprises:
for each possible rotation of the received bit stream (there being N+1×K possible rotations, K being the length of one period of the repeating first sequence) for each parity location for the given rotation, determining if the parity location is incorrect and if so, adding one to a sum being maintained for that rotation;
after some period of time, selecting the rotation having the smallest sum as being the correct rotation.

51. A method according to claim 37 further comprising:
receiving a plurality M of serial encoded outputs using the method of claim 31, where M≧2, and receiving a vertical parity channel containing parity bits computed bitwise between corresponding bit positions of the plurality M of serial encoded outputs;
making error corrections on the basis of the parity calculations and the vertical parity calculations when together they uniquely define an error position in one of the M serial encoded outputs.

* * * * *